United States Patent
Koukitsu et al.

(10) Patent No.: US 9,708,733 B2
(45) Date of Patent: Jul. 18, 2017

(54) METHOD FOR MANUFACTURING ALUMINUM-BASED GROUP III NITRIDE SINGLE CRYSTAL BY HYDRIDE VAPOR PHASE EPITAXY

(71) Applicant: TOKUYAMA CORPORATION, Shunan-shi, Yamaguchi (JP)

(72) Inventors: Akinori Koukitsu, Fuchu (JP); Yoshinao Kumagai, Fuchu (JP); Toru Nagashima, Shunan (JP); Reiko Okayama, Shunan (JP)

(73) Assignee: TOKUYAMA CORPORATION, Shunan-shi, Yamaguchi (JP)

( * ) Notice: Subject to any disclaimer, the term of this patent is extended or adjusted under 35 U.S.C. 154(b) by 10 days.

(21) Appl. No.: 14/892,875

(22) PCT Filed: Jun. 10, 2014

(86) PCT No.: PCT/JP2014/065390
§ 371 (c)(1),
(2) Date: Nov. 20, 2015

(87) PCT Pub. No.: WO2014/200001
PCT Pub. Date: Dec. 18, 2014

(65) Prior Publication Data
US 2016/0108554 A1    Apr. 21, 2016

(30) Foreign Application Priority Data

Jun. 10, 2013    (JP) .................................. 2013-121889

(51) Int. Cl.
*C30B 25/14* (2006.01)
*C30B 25/16* (2006.01)
(Continued)

(52) U.S. Cl.
CPC ............ *C30B 25/14* (2013.01); *C30B 25/165* (2013.01); *C30B 29/403* (2013.01);
(Continued)

(58) Field of Classification Search
CPC ......... C30B 25/00; C30B 25/02; C30B 25/14; C30B 25/16; C30B 25/165; C30B 29/00;
(Continued)

(56) References Cited

U.S. PATENT DOCUMENTS 7,645,340 B2 * 1/2010 Koukitu ................ C23C 16/303
                                                              117/200
9,145,621 B2    9/2015 Nagashima et al.
(Continued)

FOREIGN PATENT DOCUMENTS

JP    2003-303774 A    10/2003
JP    2007-042854 A     2/2007
(Continued)

OTHER PUBLICATIONS

International Search Report Appln. No. PCT/JP2014/065390; Dated Sep. 16, 2014.

*Primary Examiner* — Kenneth A Bratland, Jr.
(74) *Attorney, Agent, or Firm* — Ladas & Parry LLP; Loren K. Thompson

(57) ABSTRACT

The method for manufacturing an aluminum-based group III nitride single crystal includes the step of supplying an aluminum halide gas and a nitrogen source gas onto a base substrate, such that a reaction of the aluminum halide gas and the nitrogen source gas is conducted on the base substrate, wherein the reaction of the aluminum halide gas and the nitrogen source gas is conducted under coexistence of a halogen-based gas such that a halogen-based gas ratio (H) represented by the following formula (1) is no less than 0.1 and less than 1.0:

$$H = V_H/(V_H + V_{Al}) \tag{1}$$

(Continued)

(In the formula (1), $V_H$ represents a supply of the halogen-based gas; and $V_{Al}$ represents a supply of the aluminum halide gas); and a growth rate of the aluminum-based group III nitride single crystal is no less than 10 μm/h.

6 Claims, 4 Drawing Sheets

(51) Int. Cl.
     *C30B 29/40*     (2006.01)
     *H01L 21/02*     (2006.01)

(52) U.S. Cl.
     CPC ...... *H01L 21/0254* (2013.01); *H01L 21/0262* (2013.01); *H01L 21/02422* (2013.01)

(58) Field of Classification Search
     CPC ......... C30B 29/10; C30B 29/38; C30B 29/40; C30B 29/403; H01L 21/0254; H01L 21/0262; C23C 16/00; C23C 16/22; C23C 16/30; C23C 16/301; C23C 16/303; C23C 16/448; C23C 16/4481; C23C 16/452; C23C 16/45512; C23C 16/45514; C23C 16/52
     USPC .......... 117/84–86, 88–89, 93, 102, 105, 937, 117/952

See application file for complete search history.

(56) References Cited

U.S. PATENT DOCUMENTS

2004/0137657 A1*   7/2004   Dmitriev ............... C23C 16/303
                                                438/47
2012/0291698 A1   11/2012   Melnik et al.
2012/0295428 A1   11/2012   Melnik et al.

FOREIGN PATENT DOCUMENTS

JP        2012-166963 A     9/2012
WO      2012081670 A1     6/2012

* cited by examiner

Halogen-based gas ratio: H

METHOD FOR MANUFACTURING ALUMINUM-BASED GROUP III NITRIDE SINGLE CRYSTAL BY HYDRIDE VAPOR PHASE EPITAXY

TECHNICAL FIELD

The present invention relates to a new method for manufacturing an aluminum-based group III nitride single crystal.

BACKGROUND ART

Aluminum trihalide gases, for example aluminum trichloride ($AlCl_3$) gas and aluminum tribromide ($AlBr_3$) gas, are used as raw materials for manufacturing a group III nitride single crystal including aluminum (aluminum-based group III nitride single crystal). The aluminum-based group III nitride single crystal, whose band gap energy is large, enables emission of short wavelength light in the ultraviolet range. Therefore the crystal is expected to be used for ultraviolet light emitting diodes for white light sources or for sterilization, laser for read/write of high density optical disc memories, laser for communication, and the like. Thus an aluminum trihalide gas of high purity which can be used for manufacturing an aluminum-based group III nitride single crystal is required.

As a method for manufacturing an aluminum-based group III nitride single crystal using an aluminum trihalide gas, Hydride Vapor Phase Epitaxy (HVPE) is known. HVPE is a method of manufacturing a crystal by conducting a reaction of, for example, an $AlCl_3$ gas and a nitrogen source gas (e.g. ammonia gas) on a base substrate. This method is suitable as a method of growing a thick film of a single crystal.

An aluminum trihalide gas used for this HVPE method is manufactured as follows. Specifically, the gas is manufactured by a method of conducting a reaction of aluminum and a hydrogen halide gas at a temperature of 700° C. or less (see Patent Literature 1). This method makes it possible to inhibit generation of aluminum monohalide (e.g. aluminum monochloride (AlCl), aluminum monobromide (AlBr)) gases which are highly reactive with silica glass, which results in less deterioration of silica glass which is a material of HVPE devices. Patent Literature 1 describes manufacturing an aluminum-based group III nitride single crystal by flowing an aluminum trihalide gas obtained by the above method, into a crystal growth zone (on a base substrate) heated to a temperature of no less than 700° C. and no more than 1300° C., and reacting the gas with a nitrogen source gas.

According to the method described in Patent Literature 1, it is possible to inhibit generation of aluminum monohalides. However, as described in Patent Literature 1, an aluminum monohalide gas corresponding to the equilibrium state is inevitably generated, even in a tiny amount. The higher the generation temperature is, the relatively more the supply of the aluminum monohalide is. If the supply of the aluminum monohalide gas increases, the crystal quality of the aluminum-based group III nitride single crystal may degrades.

In a case where an aluminum monohalide exists as a component of an aluminum halide which is a raw material, it is known that deposition of a solid proceeds with a temperature decrease in the transportation of the aluminum monohalide gas as a driving force, which results in the deposition of metal aluminum (see Patent Literature 2 for example). In a case where the solid deposition occurs a lot in the transportation of a raw material, deposits accumulate inside pipes over time, and may peel off at an unintended timing. Further, if the peeled deposits attach to the growth surface of the aluminum-based group III nitride crystal, an abnormal growth starts from the attached deposits, which may result in degradation of the crystal quality of the aluminum-based group III nitride crystal.

In the method of Patent Literature 2, the solid deposition from the aluminum monohalide gas is intentionally promoted by: bringing aluminum and a halogen-based gas into contact with each other to form a mixed aluminum halide gas including an aluminum trihalide gas and an aluminum monohalide gas; thereafter making the mixed gas pass through an area (conversion part) having temperature lower than the temperature at which the contact was made. This method decreases the amount of the aluminum monohalide existing in the gas and inhibits the solid deposition inside pipes during the transportation of the raw material after the gas passes the conversion part.

However, with the method described in Patent Literature 2, a precise temperature control is required in the generation process and the transportation process of the aluminum halide gas. In addition, in order to more certainly remove the aluminum monohalide which causes the solid deposition, it is necessary to arrange fillers and the like, which makes the device complicated.

CITATION LIST

Patent Literatures

Patent Literature 1: JP 2003-303774 A
Patent Literature 2: WO2012/081670
Patent Literature 3: JP 2012-166963 A
Patent Literature 4: JP 2007-042854 A

SUMMARY OF INVENTION

Technical Problem

An object of the present invention is to provide a method for manufacturing an aluminum-based group III nitride single crystal, which can reduce the influence of an aluminum monohalide gas in a raw material gas of aluminum halide and increase the crystal quality with an easy way.

Solution to Problem

The inventors of the present invention found that it was possible to significantly decrease the equilibrium partial pressure of an aluminum monohalide by making an aluminum halide gas and a halogen-based gas coexist. They also found that it was possible to obtain an aluminum-based group III nitride single crystal having a good crystal quality, by conducting a reaction of the aluminum halide gas and a nitrogen source gas, under the existence of the halogen-based gas. The present invention has been made on the basis of the above findings.

The present invention is a method for manufacturing an aluminum-based group III nitride single crystal including the step of supplying an aluminum halide gas and a nitrogen source gas onto a base substrate, such that a reaction of the aluminum halide gas and the nitrogen source gas is conducted on the base substrate, wherein the reaction of the aluminum halide gas and the nitrogen source gas is conducted under coexistence of a halogen-based gas such that a halogen-based gas ratio (H) represented by the following formula (1) is no less than 0.1 and less than 1.0:

$$H = V_H/(V_H + V_{Al}) \qquad (1)$$

(In the formula (1), $V_H$ represents a supply of the halogen-based gas; $V_{Al}$ represents a supply of the aluminum halide gas; and $V_H$ and $V_{Al}$ are simultaneous supplies per unit time in terms of volumes in a standard state.); and a growth rate of the aluminum-based group III nitride single crystal is no less than 10 μm/h.

In the present invention, the "standard state" regarding a gas refers to the state of the gas at the temperature 0° C. and the pressure 1 atm. The "growth rate" of the aluminum-based group III nitride crystal refers to the increase in the film thickness of the crystal per unit time. The film thickness of the crystal can be measured by: observing a cross section of the crystal by a scanning electron microscope; measuring the thicknesses of the crystal at five or more points selected in a balanced manner; and obtaining the arithmetic average of the thicknesses.

Advantageous Effects of Invention

According to the method of the present invention, it is possible to reduce the disadvantageous effect of an aluminum monohalide gas in an aluminum halide raw material gas with an easy way, and to manufacture an aluminum-based group III nitride single crystal having an improved crystal quality. In addition, by conducting the reaction of the aluminum halide raw material gas and a nitrogen source gas under coexistence of a halogen-based gas in the aluminum halide raw material gas, it is possible to increase the growth rate of the aluminum-based group III nitride single crystal.

DESCRIPTION OF EMBODIMENTS

Figure 1:
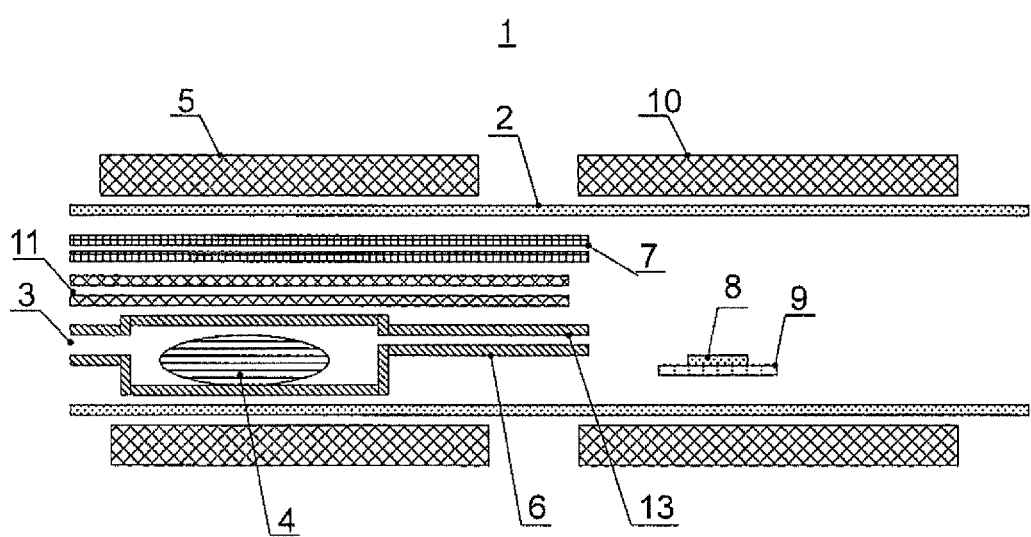
FIG. 1 is a schematic view showing one example of an aluminum-based group III nitride single crystal growth device which can be used for the method of the present invention.

Hereinafter the embodiments of the present invention will be explained with reference of the drawings. Some reference signs are omitted in the drawings. "A to B" regarding numerical values A and B means "no less than A and no more than B" unless otherwise mentioned in this description. In cases where the unit of the numerical value A is omitted, the unit given to the numerical value B is applied as the unit of the numerical value A. The embodiments shown below are examples of the present invention and the present invention is not limited to the embodiments.

(Halogen-Based Gas)

As the halogen-based gas, gases which can produce an aluminum trihalide gas by the reaction with aluminum can be used. Specific examples include chlorine gases, bromine gases, hydrogen chloride gases, and hydrogen bromide gases. Among them, hydrogen chloride gases are preferable, considering low corrosivity of the obtained aluminum trihalide gas to piping, versatility, and economic efficiency. In a case where a hydrogen chloride gas is used as the halogen-based gas, an aluminum trichloride gas, an aluminum dichloride gas, an aluminum monochloride gas, and an aluminum trichloride dimer gas are mainly produced by the reaction with aluminum.

(Aluminum)

As the aluminum to be a raw material of the aluminum halide gas, a solid having 99.99% or more of purity is preferably used. The most preferable purity of the aluminum is obviously 100%. Although a liquid aluminum can be used depending on the contacting temperature of the aluminum and the halogen-based gas, it is preferable to use a solid aluminum, considering the contact efficiency with the halogen-based gas. In a case where a solid aluminum is used, size and shape thereof are not particularly limited. Considering the contact efficiency of the aluminum and the halogen-based gas, easy flow of the halogen-based gas, pressure loss of device and the like in a device actually used, for example a cylindrical aluminum pellet of no less than 0.1 mm and no more than 10 mm in diameter and no less than 0.1 mm and no more than 10 mm in length, or a columnar aluminum pellet similar to the cylindrical aluminum pellet can be preferably used.

(Aluminum Halide Gas and Manufacturing Method thereof)

The aluminum halide gas can be produced for example by heating a powder of aluminum halide. The temperature, pressure and carrier gas flow rate at the heating can be adequately selected. The aluminum halide gas can also be manufactured by the reaction of aluminum and a halogen-based gas. Hereinafter, an example of a configuration of producing an aluminum halide gas by the reaction of aluminum and a halogen-based gas will be explained.

One example of a specific manufacturing method will be explained with FIG. 1. FIG. 1 is a view to schematically explain an example of a device for manufacturing an aluminum-based group III nitride single crystal. A device 1 shown in FIG. 1 includes
a reaction pipe 2 (made of silica glass for example), a base substrate 8 arranged inside the reaction pipe 2, a local heating means 9 for heating the base substrate 8, a growth part external heating means 10 arranged outside the reaction pipe 2, for heating a growth part where the base substrate 8 is arranged, an aluminum halide gas supply nozzle 6 arranged in a manner to eject an aluminum halide gas from oblique above the base substrate 8 to the upside of the base substrate 8, a nitrogen source gas supply nozzle 7 arranged in a manner to eject a nitrogen source gas from oblique above the base substrate 8 to the upside of the base substrate 8, a raw material arrangement part 4 connected to the aluminum halide gas supply nozzle 6, on which a metal aluminum is arranged, a halogen-based gas supply pipe 3 connected to the raw material arrangement part 4, and a raw material external heating means 5 arranged outside the reaction pipe 2, for heating the vicinity of the raw material arrangement part 4.

By conducting a reaction of the halogen-based gas supplied from the halogen-based gas supply pipe 3 and the metal aluminum arranged on the raw material arrangement part 4, it is possible to manufacture an aluminum halide gas. The manufactured aluminum halide gas passes through the aluminum halide gas supply nozzle 6 to be supplied on the base substrate 8. The aluminum halide gas preferably includes an aluminum trihalide gas as a main component, and has a composition in which the contents of aluminum monohalide gas and aluminum dihalide gas are reduced.

At the raw material arrangement part 4, an aluminum halide gas is produced by the reaction of the halogen-based gas and aluminum. The halogen-based gas can be solely supplied. However, it is preferable to dilute the halogen-based gas with a carrier gas and supply it from the halogen-based gas supply pipe 3. As the carrier gas, a hydrogen gas and/or various types of inert gases can be used. Examples of the inert gases include nitride gases, argon gases, and helium gases. As the carrier gas, one kind of the gases can be solely used, or a mixture of two or more kinds of gases can be used. Among them, it is preferable to use at least one kind selected from hydrogen gases and nitrogen gases, in view of not affecting badly the manufacture of an aluminum-based group III nitride single crystal. The supply of the carrier gas can be adequately determined according to the volume of a reactor. Generally, the supply is preferably 50 to 10000 sccm for example, and more preferably 100 to 5000 sccm. The unit sccm means the value of flow amount per one minute converted to the volume (cc) in the standard state (0° C., 1 atm).

The supply of the halogen-based gas to be supplied to the raw material arrangement part 4 on which an aluminum is arranged can be adequately determined according to the shape of device, the amount of the aluminum to be used, and the like. In a case where the aluminum halide gas including an aluminum trihalide gas as a main component is diluted with a carrier gas to be used, the concentration of the halogen-based gas to be supplied to the raw material arrangement part 4 on which a metal aluminum is arranged can be no less than 0.0001 volume % and no more than 10 volume % for example. The supply of the halogen-based gas to the raw material arrangement part 4 can be 0.005 to 100 sccm for example.

When an aluminum is arranged on the raw material arrangement part 4, a boat for accommodating the aluminum can be used. Examples of the shape of the boat include a half-cylindrical container, and the aluminum can be put on the container. As the material of the boat, silica glass and aluminum oxide hardly containing impurities can be used.

The aluminum arranged on the raw material arrangement part 4 is heated for example to no less than 100° C. and no more than 1200° C., by the raw material part external heating means 5. As the raw material part external heating means 5, a known heating means such as resistance heating, optical heating, and high frequency induction heating can be used without particular limitations.

In a case where the temperature of the aluminum on the raw material arrangement part 4 is less than 100° C., the reaction rate of the aluminum gets low and the generation amount of the aluminum halide gas itself tends to degrade. On the other hand, if the temperature is over 1200° C., the reaction inhibition effect by the halogen-based gas gets small even though the halogen-based gas is supplied, and the generation rate of the aluminum monohalide gas tends to increase. Normally, in a case where the temperature of the aluminum on the raw material arrangement part 4 is over 700° C., the generation rate of the aluminum monohalide gas increases. However, with the present invention, it is possible to reduce the rate of the aluminum monohalide gas in the aluminum halide gas, even if the generation rate of the aluminum monohalide gas is large. It should be noted that, since the melting point of aluminum is approximately 660° C., aluminum easily becomes liquid and the contact efficiency with the halogen-based gas tends to degrade in the temperature range over approximately 660° C. Considering the above, the temperature of the aluminum at the raw material arrangement part 4 is more preferably no less than 150° C. and no more than 660° C., further preferably no less than 200° C. and no more than 600° C.

(In a Case of Manufacturing Actually Only Aluminum Halide Gas)

In the present invention, it is possible to react nearly all the halogen-based gas supplied to the raw material arrangement part 4, that is, it is possible to react the halogen-based gas until the partial pressure of the aluminum halide gas reaches the equilibrium partial pressure. In this case, as described in detail below, an additional halogen-based gas is separately supplied on the crystal growth part (the base substrate 8) when the reaction of the obtained aluminum halide gas and the nitrogen-source gas is conducted. With such an configuration, it is possible to reduce the effect from the aluminum monohalide gas in the aluminum halide raw material gas with an easy way. Therefore it is possible to manufacture an aluminum-based group III nitride single crystal having an improved crystal quality and increase the growth rate of the aluminum-based group III nitride single crystal. In addition, the control of the reaction in manufacturing the aluminum halide gas gets easy.

In a case where the halogen-based gas is supplied with a carrier gas, the aluminum halide gas is supplied on the base substrate with the carrier gas. Further, an additional carrier gas can be supplied separately from the carrier gas for the halogen-based gas. As the carrier gas, like the carrier gas for the halogen-based gas, one kind or two kinds or more adequately selected from known gases such as hydrogen gases, nitrogen gases, argon gases, and helium gases can be used alone or in combination. In a case where the aluminum halide gas is supplied on the base substrate with a carrier gas, the supplies of the aluminum halide gas and the carrier gas can be determined with consideration of the size of the device and the like. Considering easy manufacturing of an aluminum-based group III nitride single crystal and the like, the supply of the carrier gas is preferably in a range of 50 to 10000 sccm, and further preferably in a range of 100 to 5000 sccm. The concentration of the aluminum halide gas can be for example no less than 0.0001 volume % and no more than 10 volume % to the carrier gas. The supply of the aluminum halide gas is preferably 0.001 to 100 sccm. The calculation method of the supply of the aluminum halide gas will be described later in detail.

It is preferable that the temperature of the aluminum halide gas does not fall below the temperature at which the aluminum halide gas is produced, from the time when the aluminum halide gas is produced by the contact of the halogen-based gas and aluminum until the aluminum halide gas is conducted to a reaction.

(In a Case of Manufacturing Mixed Gas Including Aluminum Halide Gas and Unreacted Halogen-Based Gas)

On the other hand, in the present invention, it is also possible to intentionally leave unreacted halogen-based gas at the raw material arrangement part 4, by not sufficiently proceeding with the reaction of the halogen-based gas and aluminum. Such a mixed gas can be manufactured by: changing the structure of the raw material arrangement part 4 so that the contact efficiency of the aluminum and the halogen-based gas degrades; lowering the temperature of the aluminum so that the reaction speed gets slow; or adjusting the flow rate and pressure of the halogen-based gas to shorten the staying time of the halogen-based gas at the raw material arrangement part. In this case, supplied on the base substrate 8 by the aluminum halide gas supply nozzle 6 is a mixed gas of the aluminum halide gas and the unreacted halogen-based gas. In this case as well, an additional halogen-based gas can be supplied on the base substrate 8, via another supply means from the aluminum halide gas supply nozzle 6.

Figure 3:
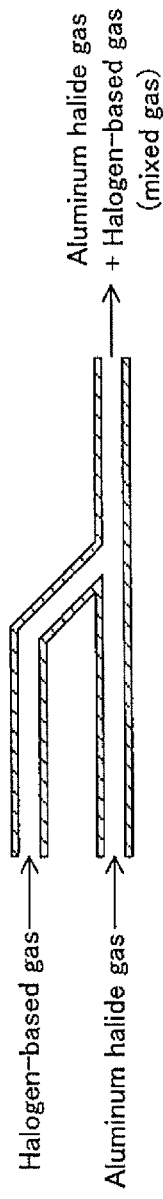
FIG. 3 is a schematic view to explain an embodiment of supplying a mixed gas for a reaction by merging an aluminum halide gas with a halogen-based gas, by means of a manifold.

For example, FIG. 1 shows an embodiment of supplying a halogen-based gas via a halogen-based gas additional supply nozzle 11, separately from the aluminum halide gas supply nozzle 6. However, the way of additionally supplying a halogen-based gas is not limited to such an embodiment. For example, a way of producing a mixed gas of the halogen-based gas and the aluminum halide gas can be employed, by letting the halogen-based gas additional supply nozzle 11 join the aluminum halide gas supply nozzle 6 at a position on the downstream side from the raw material arrangement part 4 and on the upstream side from an outlet 13 of the aluminum halide gas supply nozzle 6. As shown in FIG. 3 for example, it is possible to produce a mixed gas by merging the aluminum halide gas with the halogen-based gas by means of a manifold, and supply the mixed gas to a reaction with the nitrogen-source gas. With such a supplying configuration, it is possible to accurately control the flow rate of the halogen-based gas, by means of a mass flow adjuster such as a mass flow controller, and it is possible to increase the repeatability of the crystal growth.

Patent Literatures 1, 2 and 3 show correlation diagrams of the equilibrium partial pressure of each gas component and temperature in a case where a hydrogen chloride gas is used. The methods described in these literatures presuppose that the reaction is conducted until the halogen-based gas and aluminum reach the equilibrium partial pressure. That is, in these methods, making more than trace amount of an unreacted halogen-based gas coexist with the obtained aluminum halide gas is not presumed. Patent Literature 3 describes comparative examples in which the reaction of a solid aluminum and a hydrogen chloride gas is conducted at a relatively low temperature, and the product S×t, wherein t is the average contacting time of the solid aluminum and the hydrogen chloride gas and S is the total surface area of the solid aluminum, is less than the lower limit defined in Patent Literature 3. It is disclosed that the growth rate of crystal is extremely slow in these examples. In the present invention, it is possible to hold down the content of the aluminum monohalide gas in the aluminum halide gas, by leaving (making coexist) a predetermined ratio or more of the halogen-based gas.

Figure 2:
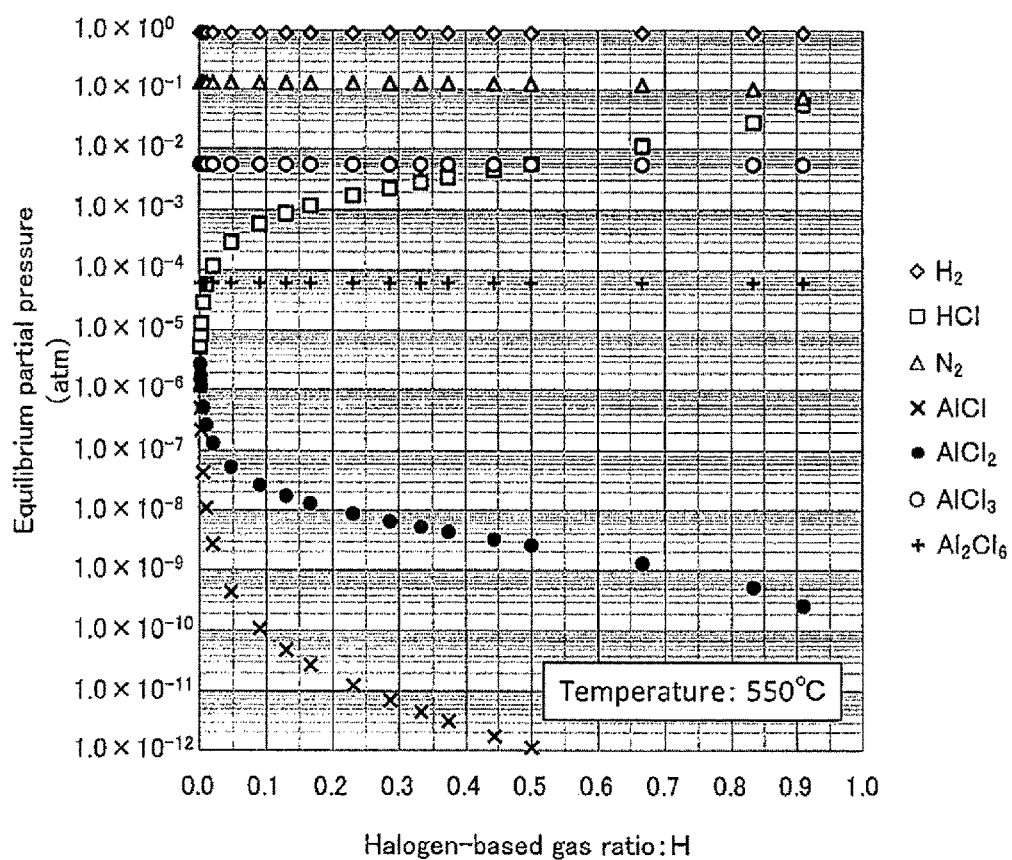
FIG. 2 is a graph showing the relationship between the equilibrium partial pressure of a gas species produced by a reaction of aluminum chloride and hydrogen chloride at 550° C. and the amount of coexisting hydrogen chloride (halogen-based gas ratio)

As one example of coexistence of a halogen-based gas, FIG. 2 shows an example in which the aluminum halide gas is an aluminum chloride gas and the halogen-based gas to coexist is a hydrogen chloride gas. FIG. 2 is a graph showing results of the calculation of the equilibrium partial pressure of each gas species, to the coexistence ratio of hydrogen chloride gas (halogen-based gas ratio:H) at 550° C. under the atmospheric pressure (1 atm), by thermodynamic analysis. The Halogen-based gas ratio H is a value calculated by the following formula (1).

$$H = V_H/(V_H + V_{Al}) \qquad (1)$$

(In the formula (1), $V_H$ represents a supply of the halogen-based gas; $V_{Al}$ represents a supply of the aluminum halide gas; and $V_H$ and $V_{Al}$ are simultaneous supplies per unit time in terms of volumes in a standard state.)

In FIG. 2, in 1 atm in total, the supply partial pressure of aluminum trichloride is fixed as 0.0055 atm, the partial pressure of hydrogen is fixed as 0.867 atm, and the total of supply partial pressures of nitrogen and hydrogen chloride is sustained as 0.128 atm. With these pressures, the supply partial pressure of the hydrogen chloride is varied (changing the halogen-based gas ratio H), to calculate the equilibrium partial pressure of each gas species. It is noted that the aluminum monohalide gas relatively generates a lot at 550° C. in the reaction of the halogen-based gas and aluminum.

From FIG. 2, it can be seen that the equilibrium partial pressures of an aluminum monochloride gas and an aluminum dichloride gas particularly get small in a case where a hydrogen chloride gas coexists (in a case where H≥0.1), compared to a case where a hydrogen chloride gas does not exist (H=0).

The hydrogen gas and nitrogen gas in FIG. 2 are originated from the carrier gas used for transporting the aluminum halide from the raw material arrangement part 4 onto the base substrate 8. In a case where a halogen gas (e.g. chloride gas) is used as the halogen-based gas as well, the halogen gas reacts with the hydrogen gas originated from the carrier gas, to be a hydrogen halide gas.

It is considered that the aluminum monohalide gas and the aluminum dihalide gas are reduced under the coexistence of the halogen-based gas because of the following equilibrium reaction.

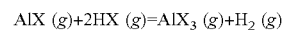

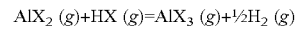

wherein X is a halogen.

In a case where a mixed gas including the aluminum halide gas and an unreacted halogen-based gas is produced at the raw material arrangement part 4, it is possible to reduce the aluminum monohalide gas and the aluminum dihalide gas included in the mixed gas itself, by the same reaction occurring between the remaining halogen-based gas and the aluminum halide gas. As a result, it is possible to inhibit the generation of a solid deposition in the transportation of the mixed gas.

As the ratio of the aluminum halide gas and the halogen-based gas in the mixed gas, the halogen-based gas ratio (H) is preferably no less than 0.10 and less than 1.00. By having the halogen-based gas ratio within the above range, it is possible to hold down the amount of the aluminum monohalide gas. Further, even if a halogen-based gas is not additionally supplied on the base substrate 8, it is possible to manufacture an aluminum-based group III nitride single crystal having a good crystal quality, by the reaction of the mixed gas and the nitrogen-source gas. Considering inhibiting the generation of the aluminum monohalide gas, the quality and productivity of the aluminum-based group III nitride single crystal and the like, the halogen-based gas ratio (H) in the mixed gas is more preferably no less than 0.10 and no more than 0.90, further preferably no less than 0.15 and no more than 0.75, and especially preferably no less than 0.15 and no more than 0.50.

In a case where the halogen-based gas is supplied with a carrier gas to the raw material arrangement part 4, the mixed gas is supplied with the carrier gas onto the base substrate 8. In addition to the carrier gas used for supplying the halogen-based gas to the raw material arrangement 4, a carrier gas can be further added to supply the mixed gas onto the base substrate 8. As the carrier gas to be added, one kind or two or more kinds of gases selected from known gases such as hydrogen gases, nitrogen gases, argon gases, and helium gases can be used alone or in combination, like the carrier gas used for supplying the halogen-based gas to the raw material arrangement part 4. In supplying the mixed gas with the carrier gas onto the base substrate 8, the supply of the aluminum halide gas and the carrier gas can be determined with consideration of the size of the device and the like. Considering easy manufacture of the aluminum-based group III nitride single crystal and the like, the supply of the carrier gas is preferably 50 to 10000 sccm, and more preferably 100 to 5000 sccm. The concentration of the mixed gas can be for example no less than 0.0001 volume % and no more than 10 volume % to the carrier gas. The mixed gas is preferably supplied in an amount with which the amount of the aluminum halide gas is 0.001 to 100 sccm. The calculation method of the supply of the mixed gas (aluminum halide gas in the mixed gas) is described later in detail.

According to the configuration of: producing a mixed gas including the aluminum halide gas and the halogen-based gas at the raw material arrangement part 4; and conducting a reaction of the mixed gas and a nitrogen source gas on the base substrate 8, the effect of the aluminum monohalide gas in the aluminum halide raw material gas can be reduced with an easy way, whereby it is possible to manufacture an aluminum-based group III nitride single crystal having an improved crystal quality and to increase the growth rate of the aluminum-based group III nitride single crystal. In addition, since the solid deposition from the aluminum monohalide in the transportation is reduced, it is possible to reduce the attachment of the deposition onto the growth surface of the aluminum-based group III nitride crystal. Further, since the existing amount of the aluminum monohalide is reduced, it is also possible to greatly reduce the corrosion of silica glass materials due to the aluminum monohalide.

It is preferable that the temperature of the aluminum halide gas does not fall below the temperature at which the aluminum halide gas is produced, from the time when the aluminum halide gas is produced by the contact of the halogen-based gas and aluminum until the aluminum halide gas is conducted to a reaction.

(Nitrogen Source Gas)

In order to obtain an aluminum-based group III nitride single crystal, a nitrogen source gas is supplied from the nitrogen source gas supply nozzle 7. As the nitrogen source gas, reactive gases containing nitrogen are employed. In view of cost and easy handling, ammonia gas is preferably used.

The nitrogen source gas is normally adequately diluted with a carrier gas to be supplied onto the base substrate 8. In a case where the nitrogen source gas is supplied with a carrier gas, one kind or two or more kinds selected from known gases such as hydrogen gases, nitrogen gases, argon gases, helium gases and the like can be used as the carrier gas, alone or in combination. In a case where the nitrogen source gas is supplied with a carrier gas onto the base substrate 8, the supplies of the nitrogen source gas and the carrier gas can be determined with consideration of the size of the device and the like. Considering easy manufacture of the aluminum-based group III nitride single crystal and the like, the supply of the carrier gas is preferably 50 to 10000 sccm, and more preferably 100 to 5000 sccm. The concentration of the nitrogen source gas can be for example no less than 0.0001 volume % and no more than 10 volume % to the carrier gas. The supply of the nitrogen source gas is preferably 0.01 to 1000 sccm.

(Base Substrate)

As the base substrate 8 onto which the aluminum-based group III nitride single crystal grows, a known base substrate can be used without particular limitations. Specific examples thereof include sapphire, silicon, silicon carbide, zinc oxide, gallium nitride, aluminum nitride, aluminum gallium nitride, gallium arsenide, zirconium boride, and titanium boride. The thickness of the base substrate is not particularly limited either, and can be 50 to 1000 μm and the like for example.

(Method for Manufacturing Aluminum-Based Group III Nitride Single Crystal)

The method of the present invention is a method for manufacturing an aluminum-based group III nitride single crystal by reacting an aluminum halide gas and a nitrogen source gas under the existence of a halogen-based gas. Hereinafter the method of the present invention will be described referring to FIG. 1 again.

In the device 1 shown in FIG. 1, the base substrate 8 is heated to an adequate growth temperature, by means of either one of the local heating means 9 and the growth part external heating means 10 alone, or both of them. The aluminum halide gas supplied from the aluminum halide gas supply nozzle 6 and the nitrogen source gas supplied from the nitrogen source gas supply nozzle 7 react with each other on the base substrate 8, and whereby an aluminum-based group III nitride single crystal grows on the base substrate 8.

It is also possible to supply a barrier gas from a nozzle, which is not shown in FIG. 1, arranged in a manner to cover at least a part of the outer periphery of the aluminum halide gas supply nozzle 6. The barrier gas is a gas used for controlling the point where the aluminum halide gas and the nitrogen source gas are mixed. Preferable examples of the barrier gas include hydrogen gases, nitrogen gases, and argon gases.

Figure 4:
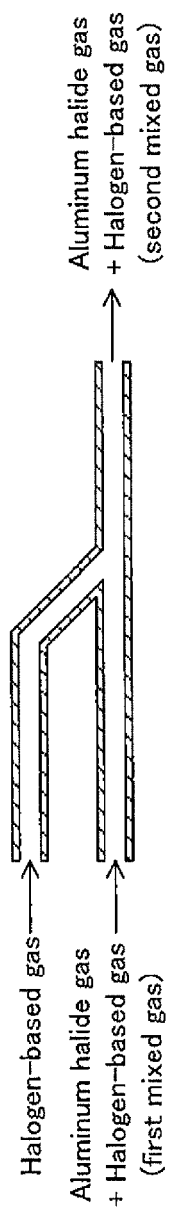
FIG. 4 is a schematic view to explain an embodiment of supplying a second mixed gas for a reaction by merging a first mixed gas including the aluminum halide gas and the halogen-based gas with an additional halogen-based gas, by means of a manifold.

In the method of the present invention, under a condition in which the halogen-based gas coexists so that the halogen-based gas ratio (H) is no less than 0.1 and less than 1.0, the reaction of the aluminum halide gas and the nitrogen source gas is conducted on the base substrate 8, to grow the aluminum-based group III nitride single crystal. As the method of realizing the reaction under the coexistence of the halogen-based gas, for example, either one or both of a method of additionally supplying a halogen-based gas onto the base substrate 8, via the halogen-based gas additional supply nozzle 11, and a method of supplying a mixed gas including the aluminum halide gas and an unreacted halogen-based gas onto the base substrate 8 can be employed. Further, for example, it is also possible to produce a mixed gas of the halogen-based gas and the aluminum halide gas, by letting the halogen-based gas additional supply nozzle 11 join the aluminum halide gas supply nozzle 6, at a position on the downstream side from the raw material arrangement part 4 and on the upstream side from the outlet 13 of the aluminum halide gas supply nozzle 6. For example, it is possible to produce a mixed gas by merging the aluminum halide gas with the halogen-based gas, by means of the manifold as shown in FIG. 3, to supply the mixed gas for a reaction with the nitrogen source gas. As shown in FIG. 4, it is also possible to produce a second mixed gas by merging a first mixed gas including the aluminum halide gas and the unreacted halogen-based gas with an additional halogen-based gas, by means of a manifold, to supply the second mixed gas for a reaction with the nitrogen source gas.

It can be considered that conducting the reaction under the existence of a halogen-based gas has the following advantages. Among aluminum halide gas species, the aluminum monohalide gas and the aluminum dihalide gas, which are considered to relate to the solid deposition, are considered to be produced due to the change of the aluminum trihalide gas to an aluminum monohalide gas and an aluminum dihalide gas, by the following two reaction formulas.

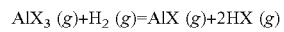

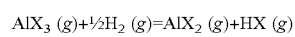

wherein X is a halogen.

As can be understood from the above formulas, by making a halogen-based gas coexist with the aluminum halide gas, it is possible to transfer the equilibrium state from the right side to the left side of the reaction formulas. As a result, it is possible to greatly reduce the content of the aluminum monohalide gas and the aluminum dihalide gas in the aluminum halide gas. That is, by applying the driving force of the equilibrium transfer, it is possible to reduce the amount of the aluminum monohalide gas included in the aluminum halide gas (convert the aluminum monohalide gas to an aluminum trihalide gas).

In the manufacturing method of the present invention, the existence ratio of the halogen-based gas (halogen-based gas ratio (H)):

$$H=V_H/(V_H+V_{Al}) \quad (1)$$

(In the formula (1), $V_H$ represents the supply of the halogen-based gas; $V_{Al}$ represents the supply of the aluminum halide gas; and $V_H$ and $V_{Al}$ are simultaneous supplies per unit time in terms of volumes in a standard state) is preferably no less than 0.10 and less than 1.00. If the halogen-based gas ratio (H) is too small, the effect of reducing the aluminum monohalide and the aluminum dihalide gets small. The halogen-based gas ratio (H) is more preferably no less than 0.10 and no more than 0.90, further preferably no less than 0.15 and no more than 0.75, and especially preferably no less than 0.15 and no more than 0.50.

At the calculation of the halogen-based gas ratio, the supply of the aluminum halide gas $V_{Al}$ and the supply of the halogen-based gas $V_H$ can be obtained by the following way, in a case where each has a fixed amount.

In a case where the aluminum halide is produced by the reaction of the halogen-based gas supplied via the halogen-based gas supply pipe 3 and the aluminum at the raw material arrangement part 4, the supply of the aluminum halide gas $V_{Al}$ depends on the reaction ratio of the halogen-based gas supplied from the halogen-based gas supply pipe 3 and the aluminum (especially aluminum reaction ratio). The aluminum reaction ratio mentioned here means the percentage of actual consumed amount of the aluminum to the consumed amount of the aluminum theoretically calculated from the supply of the halogen-based gas. For example, at the temperature range of the raw material arrangement part 4 of the present invention, an aluminum trihalide gas is preferentially produced. Therefore, the aluminum consumed amount (amount of substance) theoretically calculated is ⅓ of the amount of substance of halogen included in the halogen-based gas supplied from the halogen-based gas supply pipe 3. In fact, the aluminum reaction ratio can be calculated by: obtaining the mass decrease of the aluminum ($\Delta W_{Al}$) by the reaction with the halogen-based gas; and obtaining the aluminum consumed amount (amount of substance) of the aluminum from the mass decrease.

The supply of the aluminum halide gas $V_{Al}$ is obtained from the mass decrease of the aluminum ($\Delta W_{Al}$) arranged on the raw material arrangement part 4. At the temperature range of the raw material arrangement part 4 of the present invention, an aluminum trihalide gas is preferentially produced. Therefore, given the atomic weight of aluminum 26.9815 g/mol, the product of the reaction time T and $V_{Al}$ is calculated from the formula $$T \times V_{Al} = \Delta W_{Al}/26.9815 \times 22400 \quad (cc)$$

in terms of cubic centimeter (cc).

In the temperature range of the raw material arrangement part 4, an aluminum trihalide gas is preferentially produced. Therefore, there is a correlation shown by the following formula $$T \times V_H = T \times V_{Htotal} - 3 \times T \times V_{Al} \quad (cc)$$

among:

$T \times V_H$ (cc), the product of the supply $V_H$ of the halogen-based gas coexisting at the reaction of the aluminum halide gas and the nitrogen source gas and the reaction time T;

$T \times V_{Al}$ (cc), the product of the supply $V_{Al}$ of the aluminum halide gas and the reaction time T; and $T \times V_{Htotal}$ (cc), the product of the total supply $V_{Htotal}$ of the halogen-based gas supplied to the raw material arrangement part 4 via the halogen-based gas supply nozzle 3 and the reaction time T.

$T \times V_{Htotal}$ (cc), wherein $V_{Htotal}$ is the total supply of the halogen-based gas supplied to the raw material arrangement part 4 and T is the reaction time, is a product of the flow rate ($V_{Htotal}$ (sccm)) of the halogen-based gas to the raw material arrangement part 4 per unit time and the reaction time T (min).

For example, in manufacturing an aluminum halide gas, if the reaction ratio of the aluminum is 100%, all the halogen-based gas supplied to the raw material arrangement part 4 is used for the generation of aluminum trichloride, therefore $V_{Htotal} \approx 3 \times V_{Al}$, and the coexisting halogen-based gas supply $V_H$ is nearly zero. On the other hand, in a case where the aluminum reaction ratio is intentionally made not to be 100% and an unreacted halogen-based gas remains (producing a mixed gas including an aluminum halide gas and a halogen-based gas), the coexisting halogen-based gas supply $V_H$ exists.

In addition, a halogen-based gas can be additionally supplied via the halogen-based gas additional supply nozzle 11. In this case, the supply of the halogen-based gas to be supplied from the halogen-based gas additional supply nozzle 11 is added to the supply of the halogen-based gas supplied from the aluminum halide gas supply nozzle 6, to calculate the halogen-based gas ratio.

The aluminum halide gas supply $V_{Al}$ (sccm) and the coexisting halogen-based gas supply $V_H$ (sccm) are obtained as described, and the halogen-based gas ratio H can be obtained according to the described formulas.

As is obvious, in the calculation for obtaining the halogen-based gas supply $V_H$, if a hydrogen halide gas (e.g. HCl gas) is used as the halogen-based gas, the hydrogen halide gas is considered as one equivalent, and if a halogen gas (e.g. $Cl_2$ gas) is used, the halogen gas is considered as two equivalent (for example, 1 sccm of the supply of $Cl_2$ gas is considered as corresponding to 2 sccm of the supply of the halogen-based gas).

In a case where at least either one of the halogen-based gas supply $V_H$ and the aluminum halide gas supply $V_{Al}$ changes while crystal is growing, whether or not the halogen-based gas ratio H is in the above range can be seen by: determining the mass decrease of the aluminum $\Delta W_{Al}$ at (i) the time period when the reaction was possibly conducted under the condition of the lowest halogen-based gas ratio H, and (ii) the time period when the reaction was possibly conducted under the condition of the highest halogen-based gas ratio H, with same reaction conditions separately reproduced; and calculating the halogen-based gas ratio H at the time periods in the same way as above.

The causes of the variation of the halogen-based gas ratio H in the reaction are (1) the reaction temperature at the raw material arrangement part 4, (2) the Flow Rate of the Halogen-Based Gas at the Raw Material Arrangement part 4, (3) the flow rate of the carrier gas at the raw material arrangement part 4, and (5) the supply of the halogen-based gas supplied from the halogen-based gas additional supply nozzle 11.

(1) Regarding the reaction temperature at the raw material arrangement part 4:

(1a) in a case where an unreacted halogen-based gas remains at the raw material arrangement part 4, $V_H$ decreases and $V_{Al}$ increases, since the higher the reaction temperature at the raw material arrangement part 4 is, the faster the reaction where the aluminum halide gas is produced from the halogen-based gas is. Therefore, the higher the reaction temperature at the raw material arrangement part 4 is, the more the halogen-based gas ratio H decreases;

(1b) In a case where the reaction proceeds until the equilibrium partial pressure is achieved at the raw material arrangement part 4, the higher the reaction temperature is, the more the remaining partial pressure of the halogen-based gas increases. However, the remaining partial pressure of the halogen-based gas is 1/100 at most to the partial pressure of the aluminum halide gas. Therefore, the degree of the variation in the remaining partial pressure of the halogen-based gas is small enough to be ignored, considering the amount of the halogen-based gas to be supplied from the halogen-based gas additional supply nozzle 11. Thus the effect of the reaction temperature at the raw material arrangement part 4 on the halogen-based gas ratio H is neutral.

(2) Regarding the flow rate of the halogen-based gas at the raw material arrangement part 4:

(2a) in a case where an unreacted halogen-based gas remains at the raw material arrangement part 4, the more the flow rate of the halogen-based gas is, the more the amount of the remaining unreacted halogen-based gas increases. On the other hand, although $V_{Al}$ tends to increase as the flow rate of the halogen-based gas to the raw material arrangement part 4 increases, $V_{Al}$ does not increase so much as the increase rate of the flow of the halogen-based gas. Therefore, the increase of the flow rate of the halogen-based gas at the raw material arrangement part 4 functions in a neutral manner or in a manner of slightly increasing the halogen-based gas ratio H;

(2b) In a case where the reaction proceeds until the equilibrium partial pressure is achieved at the raw material arrangement part 4, nearly all the amount of the halogen-based gas having flown to the raw material arrangement part 4 is converted to an aluminum halide gas. Therefore, unless the amount of the halogen-based gas supplied from the halogen-based gas additional supply nozzle 11 increases, the increase of the flow rate of the halogen-based gas at the raw material arrangement part 4 functions in a manner of decreasing the halogen-based gas ratio H.

(3) Regarding the flow rate of the carrier gas at the raw material arrangement part 4:

(3a) in a case where an unreacted halogen-based gas remains at the raw material arrangement part 4, the more the flow rate of the carrier gas at the raw material arrangement part 4 is, the more the concentration of the halogen-based gas in the atmosphere in the raw material arrangement part 4 decreases, therefore the efficiency of the reaction where the halogen-based gas is converted in an aluminum halide gas decreases. Thus, the increase of the flow rate of the carrier gas at the raw material arrangement part 4 functions in a manner of increasing the halogen-based gas ratio H;

(3b) in a case where the reaction proceeds until the equilibrium partial pressure is achieved at the raw material arrangement part 4, the increase of the flow rate of the carrier gas at the raw material arrangement part 4 is neutral to both of $V_{Al}$ and $V_H$, therefore it is neutral to the halogen-based gas ratio H as well.

(4) If the supply of the halogen-based gas supplied from the halogen-based gas additional supply nozzle 11 increases, the halogen-based gas ratio H increases.

Considering the above, it is possible to know (i) the time period when the reaction was possibly conducted under a condition of the lowest halogen-based gas ratio H, and (ii) the time period when the reaction was possibly conducted under a condition of the highest halogen-based gas ratio H.

As the conditions other than the existence of the halogen-based gas, known methods can be employed. For example, before an aluminum-based group III nitride single crystal grows, it is preferable to carry out a thermal cleaning of heating the base substrate 8 while flowing a carrier gas including hydrogen, to remove organic substances attached to the base substrate. For example, in a case where the base substrate 8 is a sapphire substrate, generally, it is preferable to keep the substrate at 1000° C. or more for approximately 10 minutes. It is preferable to supply a halogen-based gas, aluminum halide gas, and nitrogen source gas onto the base substrate 8 heated preferably to 1000 to 1700° C., more preferably 1200 to 1600° C., to grow an aluminum-based group III nitride crystal on to the base substrate 8, after this thermal cleaning is carried out. As the supply concentration of the aluminum halide gas in growing the aluminum-based group III nitride crystal, the above concentration range can be preferably employed. It is preferable that the aluminum halide gas is supplied in a sufficient amount so that the growth rate of the aluminum-based group III nitride crystal is 10 µm/h or more, and more preferably 15 µm/h or more. In view of increasing the crystallinity, the growth rate of the crystal is preferably no more than 100 µm/h.

Generally, the nitrogen source gas supply (sccm) is preferably 0.5 to 200 times of the aluminum halide gas supply $V_{Al}$ (sccm).

The aluminum halide gas and the nitrogen source gas are, as described above, preferably adequately diluted with a carrier gas to be supplied. The growth time of the aluminum-based group III nitride single crystal is adequately controlled to make the crystal have a desired thickness. After the aluminum-based group III nitride single crystal is grown, the supply of the aluminum halide gas is stopped to finish the growth, and the temperature of the base substrate is decreased to the room temperature.

By reacting the aluminum halide gas and the nitrogen source gas under the existence of a halogen-based gas as described, it is possible to grow an aluminum-based group III nitride crystal. In addition, the effect of the aluminum monohalide gas in the aluminum halide raw material gas is reduced by an easy way of making a halogen-based gas coexist at the reaction of the aluminum halide gas and the nitrogen source gas, whereby it is possible to manufacture an aluminum-based group III nitride single crystal having an improved crystal quality.

In addition, in order to obtain an aluminum-based group III nitride single crystal having a higher quality, various growth methods can be applied such as: a method of growing a buffer layer of 100 nm or less in thickness on the base substrate at the initial stage of the growth, and forming a thick film on the buffer layer by means of HVPE; a method of forming a template film having a good crystal quality on the base substrate with a method other than HVPE, and forming a thick film on the template film by means of HVPE; and a method of shaping the base substrate in strips or dots and forming a thick film while growing the crystal in a lateral direction on the surface of the shaped base substrate by means of HVPE.

Further, in a case where an aluminum-based group III nitride single crystal including Al and a group III element other than Al such as Ga, In, and B is manufactured as well, it is possible to obtain an aluminum-based group III nitride crystal having a good crystal quality, by growing the crystal under the existence of a halogen-based gas, according to the method of the present invention. The manufacturing method of the present invention can be preferably employed in manufacturing an aluminum-based group III nitride single crystal, by reacting a nitrogen source gas and a group III halide gas including an aluminum trihalide gas.

The present invention is not limited to the above-mentioned embodiments, and the embodiments can be changed in various ways, within the range of the present invention. For example, the posture of the raw material arrangement part 4 and/or the growth part is not limited to a horizontal arrangement. They can be arranged vertically or obliquely. In the device 1 shown in FIG. 1, both the raw material part (the point where the aluminum halide gas is produced) and the growth part (the point where the aluminum-based group III nitride crystal is manufactured) are arranged inside the single reaction pipe 2. However, the manufacturing method of the present invention can also be carried out by means of a device having a configuration in which the raw material part and the growth part are separated. In this case, the aluminum halide gas is transported from the raw material part to the growth part, via a pipe connecting the raw material part and the growth part.

EXAMPLES

Hereinafter the specific Examples and Comparative Examples of the present invention are described referring to the drawings. However, the present invention is not limited to these Examples.

Example 1

In this example, an aluminum nitride single crystal was grown by means of the device 1 shown in FIG. 1, by producing a mixed gas including an aluminum halide gas and an unreacted halogen-based gas, and reacting the mixed gas and a nitrogen source gas.

The reaction pipe 2 made of silica glass was prepared. A solid aluminum pellet of 99.9999% in purity, 5 mm in diameter and 6 mm in length (total weight 200 g) on a half cylindrical silica glass boat was arranged on the raw material arrangement part 4 on the upstream side. As the external heating means 5, an electric furnace of resistance heating type was arranged outside the reaction pipe 2, and the raw material arrangement part 4 was heated to 400° C. Thereafter, 30 sccm of hydrogen chloride gas was mixed with a carrier gas (consisting of 1560 sccm of hydrogen gas and 210 sccm of nitrogen gas) and supplied to the raw material arrangement part 4. By the reaction of the hydrogen chloride gas and the aluminum, an aluminum chloride gas including an aluminum trihalide gas as a main component was produced.

The aluminum chloride gas produced at the raw material arrangement part 4 was supplied onto the base substrate 8 arranged on the local heating means 9, via the aluminum halide gas supply nozzle 6. As the base substrate 8, a commercially available aluminum nitride single crystal substrate grown by means of physical vapor transport deposition was used. In addition, 40 sccm of ammonia gas diluted with 160 sccm of hydrogen carrier gas was supplied via the nitrogen source gas supply nozzle 7. From the outer periphery of the aluminum halide gas supply nozzle 6 and the nitrogen source gas supply nozzle 7, 5600 sccm of hydrogen gas and 2400 sccm of nitrogen gas were supplied, as gases for pushing out the whole atmosphere existing inside the reaction pipe 2. The base substrate 8 was heated to 1450° C., by means of induction heating where a susceptor made of graphite was induced and heated with high frequency, as the local heating means of the base substrate 8. In this example, an aluminum nitride was grown at a fixed temperature, with a fixed gas flow, for 60 minutes (reaction time T=60 min), without a supply of the halogen-based gas from the halogen-based gas additional supply nozzle 11.

After the aluminum nitride was grown, the supply of the hydrogen chloride gas and ammonia gas was stopped, and the base substrate was cooled to the room temperature. Thereafter, the mass decrease of the aluminum arranged on the raw material arrangement part 4 was confirmed. Confirmed was 0.694 g of consumption. $T \times V_{Al}$, the product of the aluminum chloride gas supply and the reaction time was calculated as 576 cc (employing an approximation that the all produced aluminum chloride gas was an aluminum trichloride gas). $T \times V_{Htotal}$, the product of the total amount of the supply of the hydrogen chloride gas and the reaction time was 1800 cc. Therefore, $T \times V_H$, the product of the coexisting hydrogen chloride gas and the reaction time was calculated as 72 cc, and the halogen-based gas ratio H (in this example, HCl ratio) was calculated as 0.11.

The thickness of the aluminum nitride crystal film grown on the base substrate 8 was 18 μm, and the full width at half maximum (FWHM) of X-ray rocking curve on the (002) diffraction face of the grown aluminum nitride crystal film was 30 arcsec. A slight amount of solid substance was attached to the inner wall of the aluminum halide gas supply nozzle 6. The aluminum halide gas supply nozzle 6 was removed and the solid substance was subjected to an elemental analysis by means of energy dispersive X-ray spectroscopy. The solid substance was observed at aluminum 100 atom %, and any chloride component was not observed. It was found that the solid substance was a metal aluminum. Further, the inner wall of the aluminum halide gas supply nozzle 6 was washed with a sodium hydroxide aqueous solution of 1 mol/L in concentration. The attached aluminum was collected and the amount of aluminum component included in the solution was determined by means of inductive coupling plasma atomic emission spectroscopy. The amount of the metal aluminum deposited on the inner wall of the aluminum halide gas supply nozzle 6 was 0.1 mg. The conditions and results are shown in Table 1.

Example 2

In this example, the crystal was grown with a different halogen-based gas ratio H from that of Example 1. An aluminum nitride crystal film was grown in the same way as in Example 1, except that the filling amount of aluminum on the silica glass boat was changed to 150 g.

After the crystal was grown, the supply of the hydrogen chloride gas and ammonia gas was stopped and the base substrate was cooled to the room temperature. Thereafter, the mass decrease of the aluminum arranged on the raw material arrangement part 4 was confirmed. Confirmed was 0.664 g of consumption. $T \times V_{Al}$, the product of the aluminum chloride gas supply and the reaction time was calculated as 551 cc (employing an approximation that the all produced aluminum chloride gas was an aluminum trichloride gas). $T \times V_{Htotal}$, the product of the total amount of the hydrogen chloride gas supply and the reaction time was 1800 cc. Therefore $T \times V_H$, the product of the coexisting hydrogen chloride gas supply and the reaction time was calculated as 147 cc, and the halogen-based gas ratio H was calculated as 0.21.

The thickness of the aluminum nitride crystal film grown on the base substrate 8 was 35 μm, and the full width at half maximum (FWHM) of X-ray rocking curve on the (002) diffraction face was 25 arcsec. The amount of the metal aluminum deposited on the inner wall of the aluminum halide gas supply nozzle 6 was 0.0 mg, that is, a lower limit or less of detection. The conditions and results are shown in Table 1.

Example 3

In this example, the crystal was grown with a different halogen-based gas ratio H from that of Examples 1 and 2. An aluminum nitride crystal film was grown in the same way as in Example 1, except that the filling amount of the aluminum on the silica glass boat was changed to 100 g.

After the crystal was grown, the supply of the hydrogen chloride gas and ammonia gas was stopped, and the base substrate was cooled to the room temperature. Thereafter, the mass decrease of the aluminum arranged on the raw material arrangement part 4 was confirmed. Confirmed was 0.617 g of consumption. $T \times V_{Al}$, the product of the aluminum chloride gas supply and the reaction time was calculated as 512 cc (employing an approximation that the all produced aluminum chloride gas was an aluminum trichloride gas). $T \times V_{Htotal}$, the product of the total amount of the hydrogen chloride gas supply and the reaction time was 1800 cc. Therefore, $T \times V_H$, the product of the coexisting hydrogen chloride gas supply and the reaction time was calculated as 264 cc, and the halogen-based gas ratio H was calculated as 0.34.

The thickness of the aluminum nitride crystal film grown on the base substrate 8 was 24 μm, and the full width at half maximum (FWHM) of X-ray rocking curve on the (002) diffraction face was 21 arcsec. The amount of metal aluminum deposited on the inner wall of the aluminum halide gas supply nozzle 6 was 0.0 mg, that is, the lower limit or less of detection. The conditions and results are shown in Table 1.

Example 4

In this example, the halogen-based gas ratio was changed by changing the temperature of the raw material arrangement part 4. An aluminum nitride crystal film was grown in the same way as in Example 3, except that the temperature of the raw material arrangement part 4 was changed to 550° C.

After the crystal was grown, the supply of the hydrogen chloride gas and ammonia gas was stopped and the base substrate was cooled to the room temperature. Thereafter the mass decrease of the aluminum arranged on the raw material arrangement part 4 was confirmed. Confirmed was 0.664 g of consumption. $T \times V_{Al}$, the product of the aluminum chloride gas supply and the reaction time was calculated as 551 cc (employing an approximation that the all produced aluminum chloride gas was an aluminum trichloride gas). $T \times V_{Htotal}$ the product of the total amount of the hydrogen chloride gas supply and the reaction time was 1800 cc. Therefore, $T \times V_H$, the product of the coexisting hydrogen chloride gas and the reaction time was calculated as 147 cc, and the halogen-based gas ratio H was calculated as 0.21.

The thickness of the aluminum nitride crystal film grown on the base substrate 8 was 22 μm, and the full width at half maximum (FWHM) of X-ray rocking curve on the (002) diffraction face was 27 arcsec. The amount of the metal aluminum deposited on the inner wall of the aluminum halide gas supply nozzle 6 was 0.1 mg. The conditions and results are shown in Table 1.

Example 5

In this example, the halogen-based gas ratio was changed by changing the temperature of the raw material arrangement part 4. An aluminum nitride crystal film was grown in the same way as in the Example 1, except that the temperature of the raw material arrangement part 4 was changed to 300° C.

After the crystal was grown, the supply of the hydrogen chloride gas and ammonia gas was stopped and the base substrate was cooled to the room temperature. Thereafter, the mass decrease of the aluminum arranged on the raw material arrangement part 4 was confirmed. Confirmed was 0.677 g of consumption. $T \times V_{Al}$, the product of the aluminum chloride gas supply and the reaction time was calculated as 562 cc (employing an approximation that all the produced aluminum chloride gas was an aluminum trichloride gas). $T \times V_{Htotal}$, the product of the total amount of the hydrogen chloride gas supply and the reaction time was 1800 cc. Therefore, $T \times V_H$, the product of the coexisting hydrogen chloride gas supply and the reaction time was calculated as 114 cc, and the halogen-based gas ratio H was calculated as 0.17.

The thickness of the aluminum nitride crystal film grown on the base substrate 8 was 34 μm, and the full width at half maximum (FWHM) of X-ray rocking curve on the (002) diffraction face was 23 arcsec. The amount of the metal aluminum deposited on the inner wall of the aluminum halide gas supply nozzle 6 was 0.0 mg, that is, the lower limit or less of detection. The conditions and results are shown in Table 1.

Example 6

In this example, the halogen-based gas ratio was changed by changing the temperature of the raw material arrangement part 4. An aluminum nitride crystal film was grown in the same way as in Example 1, except that the temperature of the raw material arrangement part 4 was changed to 200° C.

After the crystal was grown, the supply of the hydrogen chloride gas and ammonia gas was stopped and the base substrate was cooled to the room temperature. Thereafter, the mass decrease of the aluminum arranged on the raw material arrangement part 4 was confirmed. The confirmed was 0.680 g of consumption. $T \times V_{Al}$, the product of the aluminum chloride gas supply and the reaction time was calculated as 565 cc (employing an approximation that all the produced aluminum chloride gas was an aluminum trihalide gas). $T \times V_{Htotal}$, the product of the total amount of the hydrogen chloride gas supply and the reaction time was 1800 cc. Therefore, $T \times V_H$, the product of the coexisting hydrogen chloride gas supply and the reaction time was calculated as 105 cc, and the halogen-based gas ratio H was calculated as 0.16.

The thickness of the aluminum nitride crystal film grown on the base substrate 8 was 37 μm, and the full width at half maximum (FWHM) of X-ray rocking curve on the (002) diffraction face was 21 arcsec. The amount of the metal aluminum deposited on the inner wall of the aluminum halide gas supply nozzle 6 was 0.0 mg, that is, the lower limit or less of detection. The conditions and results are shown in Table 1.

Comparative Example 1

In this comparative example, the crystal was grown under a condition that the halogen-based gas ratio was 0. An aluminum nitride crystal film was grown in the same way as in Example 1, except that the filling amount of the aluminum on the silica glass boat was changed to 400 g.

After the crystal was grown, the supply of the hydrogen chloride gas and ammonia gas was stopped and the base substrate was cooled to the room temperature. Thereafter the mass decrease of the aluminum arranged on the raw material arrangement part 4 was confirmed. Confirmed was 0.723 g of consumption. $T \times V_{Al}$, the product of the aluminum chloride gas supply and the reaction time was calculated as 600 cc (employing an approximation that all the produced aluminum chloride gas was an aluminum trichloride gas). $T \times V_{Htotal}$, the product of the total amount of the hydrogen chloride gas supply and the reaction time was 1800 cc, which means the reaction ratio of the aluminum was 100%. Thus, $T \times V_H$, the product of the coexisting hydrogen chloride gas supply and the reaction time was calculated as 0 cc, and the halogen-based gas ratio H was calculated as 0.00.

The thickness of the aluminum nitride crystal film grown on the base substrate 8 was 5.7 μm, and the full width at half maximum (FWHM) of X-ray rocking curve on the (002) diffraction face was 68 arcsec. The amount of the metal aluminum deposited on the inner wall of the aluminum halide gas supply nozzle 6 was 0.9 mg. The conditions and results are shown in Table 1.

Comparative Example 2

In this comparative example, the crystal was grown under a condition that the halogen-based gas ratio was 0. An aluminum nitride crystal film was grown in the same way as in Example 1, except that the filling amount of the aluminum on the silica glass boat was 250 g, and the temperature of the raw material arrangement part 4 was 550° C.

After the crystal was grown, the supply of the hydrogen chloride gas and ammonia gas was stopped and the base substrate was cooled to the room temperature. Thereafter, the mass decrease of the aluminum arranged on the raw material arrangement part 4 was confirmed. Confirmed was 0.723 g of consumption. $T \times V_{Al}$, the product of the aluminum chloride gas supply and the reaction time was calculated as 600 cc (employing an approximation that all the produced aluminum chloride gas was an aluminum trichloride gas). $T \times V_{Htotal}$, the product of the total amount of the hydrogen chloride gas supply and the reaction time was 1800 cc, which means the reaction ratio of the aluminum was 100%. Thus, $T \times V_H$, the product of the coexisting hydrogen chloride gas supply and the reaction time was calculated as 0 cc, and the halogen-based gas ratio H was calculated as 0.00.

The thickness of the aluminum nitride crystal film grown on the base substrate 8 was 6.0 μm, and the full width at half maximum (FWHM) of X-ray rocking curve on the (002) diffraction face was 95 arcsec. The amount of the metal aluminum deposited on the inner wall of the aluminum halide gas supply nozzle 6 was 7.5 mg. The conditions and results are shown in Table 1.

Comparative Example 3

In this comparative example, the crystal was grown under a condition that the halogen-based gas ratio was smaller than the range of the present invention by increasing the amount of the aluminum to be arranged on the raw material arrangement part 4. An aluminum nitride crystal film was grown in the same way as in Example 1, except that the filling amount of the aluminum on the silica glass boat was 250 g.

After the crystal was grown, the supply of the hydrogen chloride gas and ammonia gas was stopped and the base substrate was cooled to the room temperature. Thereafter, the mass decrease of the aluminum arranged on the raw material arrangement part 4 was confirmed. Confirmed was 0.720 g of consumption. $T \times V_{Al}$, the product of the aluminum chloride gas supply and the reaction time was calculated as 598 cc (employing an approximation that all the produced aluminum chloride gas was an aluminum trichloride gas). $T \times V_{Htotal}$, the product of the total amount of the hydrogen chloride gas supply and the reaction time was 1800 cc. Therefore $T \times V_H$, the product of the coexisting hydrogen chloride gas supply and the reaction time was calculated as 6 cc, and the halogen-based gas ratio H was calculated as 0.01.

The thickness of the aluminum nitride crystal film grown on the base substrate 8 was 8.2 μm, and the full width at half maximum (FWHM) of X-ray rocking curve on the (002) diffraction face was 37 arcsec. The amount of the metal aluminum deposited on the inner wall of the aluminum halide gas supply nozzle 6 was 0.2 mg. The conditions and results are shown in Table 1.

Example 7

In this example, a mixed gas of 0.1 or more of halogen-based gas ratio, made by an additional supply of a halogen-based gas to the aluminum halide gas hardly including unreacted halogen-based gas and produced at the raw material arrangement part 4, was supplied on the base substrate 8, by means of a device (see FIG. 3) which has a different structure from the device 1 shown in FIG. 1 in that the halogen-based gas additional supply nozzle 11 joined the upstream portion of the outlet 13 of the aluminum halide gas supply nozzle 6, to be arranged on the base substrate 8 as one nozzle. An aluminum nitride single crystal was grown by the reaction of the mixed gas and a nitrogen source gas.

The structure of the device 1 (see FIG. 1) used in Example 1 was changed in a manner of letting the halogen-based gas additional supply nozzle 11 join the upstream side of the outlet 13 of the aluminum halide gas supply nozzle 6, so that the aluminum halide gas merges with the halogen-based gas to be a mixed gas (see FIG. 3).

The filling amount of the aluminum on the silica glass boat was changed to 600 g, and the raw material arrangement part 4 was heated to 400° C. A hydrogen chloride gas in an amount of 9.9 sccm was mixed with a carrier gas (consisting of 1560 sccm of hydrogen gas and 230.1 sccm of nitrogen gas) and supplied to the raw material arrangement part 4. By the reaction of the hydrogen chloride gas and the aluminum, an aluminum chloride gas including aluminum trichloride gas as a main component was produced. In addition, 20 sccm of ammonia gas diluted with 180 sccm of a hydrogen carrier gas was supplied via the nitrogen source gas supply nozzle 7. Further, 3.3 cssm of hydrogen chloride gas was supplied from the halogen-based gas additional supply nozzle 11. The hydrogen chloride gas supplied from the halogen-based gas additional supply nozzle 11 merged with the aluminum chloride gas led from the raw material arrangement part 4 by the manifold, to be a mixed gas. The mixed gas was supplied for the reaction with the ammonia gas. The reaction was carried out with the supply of the above-mentioned gases whose amounts were controlled to have an accuracy of ±1%, by means of a mass flow controller. An aluminum nitride crystal film was grown in the same way as in Example 1 except the above-noted conditions.

After the crystal was grown, the supply of the hydrogen chloride gas and ammonia gas was stopped and the base substrate was cooled to the room temperature. Thereafter the mass decrease of the aluminum arranged on the raw material arrangement part 4 was confirmed. Confirmed was 0.238 g of consumption. The total amount of the hydrogen chloride reacted with the aluminum was calculated as 3×198 cc (employing an approximation that all the produced aluminum chloride gas was an aluminum trichloride gas). Therefore, it was confirmed that the reaction ratio of the aluminum was 100%.

$T \times V_{Al}$, the total amount of the gas corresponding to the aluminum trichloride produced from the hydrogen chloride gas supplied on the raw material arrangement part 4 was 198 cc, and the coexisting hydrogen chloride gas supply amount $t \times V_H$ was 198 cc. Therefore, the halogen-based gas ratio H was calculated as 0.50.

The thickness of the aluminum nitride crystal film grown on the base substrate 8 was 19 μm, and the full width at half maximum (FWHM) of X-ray rocking curve on the (002) diffraction face was 30 arcsec. The amount of the metal aluminum deposited on the inner wall of the aluminum halide gas supply nozzle 6 was 0.0 mg. The conditions and results are shown in Table 1.

Example 8

An aluminum nitride crystal film was grown in the same way as in Example 7, except that 9.9 sccm of hydrogen nitride gas was supplied from the halogen-based additional supply nozzle 11.

After the crystal was grown, the supply of the hydrogen chloride gas and ammonia gas was stopped and the base substrate was cooled to the room temperature. Thereafter the mass decrease of the aluminum arranged on the raw material arrangement part 4 was confirmed. Confirmed was 0.238 g of consumption. The total amount of the hydrogen chloride reacted with the aluminum was calculated as 3×198 cc (employing an approximation that all the produced aluminum chloride gas was an aluminum trichloride gas). Therefore, it was confirmed that the reaction ratio of the aluminum was 100%.

$T \times V_{Al}$, the total amount of the gas corresponding to the aluminum trichloride produced from the hydrogen chloride gas supplied from the raw material arrangement part 4 was 198 cc, and the coexisting hydrogen chloride gas supply amount $T \times V_H$ was 594 cc. Therefore, the halogen-based gas ratio H was calculated as 0.75.

The thickness of the aluminum nitride crystal film grown on the base substrate 8 was 20 μm, and the full width at half maximum (FWHM) of X-ray rocking curve on the (002) diffraction face was 28 arcsec. The amount of the metal aluminum deposited on the inner wall of the aluminum halide gas supply nozzle 6 was 0.0 mg. The conditions and results are shown in Table 1.

Example 9

An aluminum nitride crystal film was grown in the same way as in Example 7, except that 24.2 sccm of hydrogen chloride gas was supplied from the halogen-based additional supply nozzle 11.

After the crystal was grown, the supply of the hydrogen chloride gas and ammonia gas was stopped and the base substrate was cooled to the room temperature. Thereafter the mass decrease of the aluminum arranged on the raw material arrangement part 4 was confirmed. Confirmed was 0.238 g of consumption. The total amount of the hydrogen chloride reacted with the aluminum was calculated as 3×198 cc (employing an approximation that all the produced aluminum chloride gas was an aluminum trichloride gas). Therefore, it was confirmed that the reaction ratio of the aluminum was 100%.

$T \times V_{Al}$, the total amount of the gas corresponding to the aluminum trichloride produced from the hydrogen chloride gas supplied from the raw material arrangement part 4 was 198 cc, and the coexisting hydrogen chloride gas supply amount $T \times V_H$ was 1452 cc. Therefore, the halogen-base gas ratio H was calculated as 0.88.

The thickness of the aluminum nitride crystal film grown on the base substrate 8 was 18 μm, and the full width at half maximum (FWHM) of X-ray rocking curve on the (002) diffraction face was 27 arcsec. The amount of the metal aluminum deposited on the inner wall of the aluminum halide gas supply nozzle 6 was 0.0 mg. The conditions and results are shown in Table 1.

Example 10

An aluminum nitride crystal film was grown in the same way as in Example 8 except that the temperature of the raw material arrangement part was 500° C.

After the crystal was grown, the supply of the hydrogen gas and ammonia gas was stopped and the base substrate was cooled to the room temperature. Thereafter the mass decrease of the aluminum arranged on the raw material arrangement part 4 was confirmed. Confirmed was 0.238 g of consumption. The total amount of the hydrogen chloride reacted with the aluminum was calculated as 3×198 cc (employing an approximation that all the produced aluminum chloride gas was an aluminum trichloride gas). Therefore it was confirmed that the reaction ratio of the aluminum was 100%.

$T \times V_{Al}$, the total amount of the gas corresponding to the aluminum trichloride produced from the hydrogen chloride gas supplied to the raw material arrangement part 4 was 198 cc, and the coexisting hydrogen chloride gas supply amount $T \times V_H$ was 594 cc. Therefore, the halogen-based gas ratio H was calculated as 0.75.

The thickness of the aluminum nitride crystal film grown on the base substrate 8 was 19 μm, and the full width at half maximum (FWHM) of X-ray rocking curve on the (002) diffraction face was 26 arcsec. The amount of the metal aluminum deposited on the inner wall of the aluminum halide gas supply nozzle 6 was 0.0 mg. The conditions and results are shown in Table 1.

Example 11

In this example, by means of the device 1 shown in FIG. 1, an aluminum halide raw material gas hardly including unreacted halogen-based gas was produced at the raw material arrangement part 4 and supplied on the base substrate 8, and a halogen-based gas was additionally supplied from the halogen-based gas additional supply nozzle 11.

The filling amount of the aluminum on the silica glass boat was changed 20 to 600 g, and the raw material arrangement part 4 was heated to 400° C. A hydrogen chloride gas in an amount of 9.9 sccm was mixed with a carrier gas (consisting of 1560 sccm of hydrogen gas and 230.1 sccm of nitrogen gas) and supplied on the raw material arrangement part 4. By the reaction of the hydrogen chloride gas and the aluminum, an aluminum chloride gas including an aluminum trichloride gas as a main component was produced. In addition, 20 sccm of ammonia gas diluted with 180 sccm of hydrogen carrier gas was supplied via the nitrogen source gas supply nozzle 7. Further, 5.0 sccm of hydrogen chloride gas was supplied from the halogen-based gas additional supply nozzle 11. An aluminum nitride crystal film was grown in the same manner as in Example 1, except the above-noted conditions. The reaction was carried out with the supply of the above-noted gases whose amounts were controlled to have an accuracy of ±1%, by means of a mass flow controller.

After the crystal was grown, the supply of the hydrogen chloride gas and ammonia gas was stopped and the crystal was cooled to the room temperature. Thereafter, the mass decrease of the aluminum arranged on the raw material arrangement part 4 was confirmed. Confirmed was 0.238 g of consumption. The total amount of the hydrogen chloride reacted with the aluminum was calculated as 3×198 cc (employing an approximation that all the produced aluminum chloride gas was an aluminum trichloride gas). Therefore, it was confirmed that the reaction ratio of the aluminum was 100%.

$T \times V_{Al}$, the total amount of the gas corresponding to the aluminum trichloride produced from the hydrogen chloride gas supplied to the raw material arrangement part 4 was 198 cc, and the coexisting hydrogen chloride gas supply amount $T \times V_H$ was 300 cc. Therefore, the halogen-based gas ratio H was calculated as 0.60.

The thickness of the aluminum nitride crystal film grown on the base substrate 8 was 18 μm, and the full width at half maximum (FWHM) of X-ray rocking curve on the (002) diffraction face was 29 arcsec. The amount of the metal aluminum deposited on the inner wall of the aluminum halide gas supply nozzle 6 was 0.2 mg. The conditions and results are shown in Table 1.

TABLE 1

| | temperature of raw material arrangement part °C. | $V_H$ HCl ratio | Al deposition amount at nozzle inner wall mg | (002) half width arcsec | growth rate μm/h |
|---|---|---|---|---|---|
| Example 1 | 400 | 0.11 | 0.1 | 30 | 18 |
| Example 2 | 400 | 0.21 | 0.0 | 25 | 35 |
| Example 3 | 400 | 0.34 | 0.0 | 21 | 24 |
| Example 4 | 550 | 0.21 | 0.1 | 27 | 22 |
| Example 5 | 300 | 0.17 | 0.0 | 23 | 34 |
| Example 6 | 200 | 0.16 | 0.0 | 21 | 37 |
| Example 7 | 400 | 0.50 | 0.0 | 30 | 19 |
| Example 8 | 400 | 0.75 | 0.0 | 28 | 20 |
| Example 9 | 400 | 0.88 | 0.0 | 27 | 18 |
| Example 10 | 500 | 0.75 | 0.0 | 26 | 19 |
| Example 11 | 400 | 0.60 | 0.2 | 29 | 18 |
| Comparative Example 1 | 400 | 0.00 | 0.9 | 68 | 5.7 |
| Comparative Example 2 | 550 | 0.00 | 7.5 | 95 | 6.0 |
| Comparative Example 3 | 400 | 0.01 | 0.2 | 37 | 8.2 |

In Examples 1 to 6, in which a mixed gas including an aluminum halide gas and an unreacted halogen-based gas was used and the halogen-based gas ratio was 0.1 or more, it was possible to inhibit Al deposition on the inner wall of the nozzle, and to obtain a single crystal having a good crystallinity, with a high growth rate.

In Examples 7 to 10 as well, in which an aluminum halide gas hardly including unreacted halogen-based gas was produced at the raw material arrangement part 4 and merged with the halogen-based gas by a manifold to make the halogen-based gas ratio 0.1 or more, thereafter supplied for the reaction with the nitrogen source gas, it was possible to inhibit Al deposition on the inner wall of the nozzle and to obtain a single crystal having a good crystallinity, with a high growth rate.

In Example 11 as well, in which an aluminum halide raw material gas hardly including unreacted halogen-based gas was produced at the raw material arrangement part 4 and supplied on the base substrate 8, and a halogen-based gas is additionally supplied from the halogen-based additional supply nozzle 11 to make the halogen-based gas ratio 0.1 or more, it was possible to obtain a single crystal having a good crystallinity, with a high growth rate.

REFERENCES SIGN LIST

1 device
2 reaction pipe
3 halogen-based gas supply pipe
4 raw material arrangement part
5 raw material part external heating means
6 aluminum halide gas supply nozzle
7 nitrogen source gas supply nozzle
8 base substrate
9 local heating means
10 growth part external heating means
11 halogen-based gas additional supply nozzle

The invention claimed is:

1. A method for manufacturing an aluminum-based group III nitride single crystal comprising the step of:
supplying at least one aluminum halide gas and a nitrogen source gas onto a base substrate, such that a reaction of the at least one aluminum halide gas and the nitrogen source gas is conducted on the base substrate,
wherein the reaction of the at least one aluminum halide gas and the nitrogen source gas is conducted under coexistence of a halogen-based gas other than any aluminum halide gas such that a halogen-based gas ratio (H) represented by the following formula (1) is no less than 0.1 and less than 1.0:

$$H = V_H / (V_H + V_{Al}) \qquad (1)$$

wherein in the formula (1), $V_H$ represents a supply of the halogen-based gas other than any aluminum halide gas; $V_{Al}$ represents a total supply of the at least one aluminum halide gas; and $V_H$ and $V_{Al}$ are simultaneous supplies per unit time in terms of volumes in a standard state; and a growth rate of the aluminum-based group III nitride single crystal is no less than 10 μm/h.

2. The method for manufacturing an aluminum-based group III nitride single crystal according to claim 1, wherein the reaction of the at least one aluminum halide gas and the nitrogen source gas under coexistence of the halogen-based gas other than any aluminum halide gas comprises the steps of:

reacting aluminum and the halogen-based gas other than any aluminum halide gas such that unreacted said halogen-based gas other than any aluminum halide gas remains, such that a mixed gas comprising the at least one aluminum halide gas and the unreacted halogen-based gas other than any aluminum halide gas is produced; and bringing the mixed gas and the nitrogen source gas into contact with each other.

3. The method for manufacturing an aluminum-based group III nitride single crystal according to claim 1, wherein the reaction of the at least one aluminum halide gas and the nitrogen source gas under coexistence of the halogen-based gas other than any aluminum halide gas comprises the step of:

supplying the halogen-based gas other than any aluminum halide gas onto the base substrate by a supplying means separate from a supplying means of the at least one aluminum halide gas, such that the halogen-based gas other than any aluminum halide gas coexists.

4. The method for manufacturing an aluminum-based group III nitride single crystal according to claim 1, wherein a hydrogen chloride gas is used as the halogen-based gas.

5. The method for manufacturing an aluminum-based group III nitride single crystal according to claim 4, wherein the at least one aluminum halide gas comprises aluminum trichloride gas, and optionally further comprises one or more gas selected from the group consisting of: aluminum monochloride gas, aluminum dichloride gas, and aluminum trichloride dimer gas.

6. The method for manufacturing an aluminum-based group III nitride single crystal according to claim 1, wherein the at least one aluminum halide gas comprises an aluminum trihalide gas, and optionally further comprises an aluminum monohalide gas and/or an aluminum dihalide gas.

* * * * *